(12) United States Patent
Lai et al.

(10) Patent No.: US 7,576,987 B2
(45) Date of Patent: Aug. 18, 2009

(54) CLIP FOR HEAT DISSIPATION DEVICE

(75) Inventors: Cheng-Tien Lai, Tu-Cheng (TW); Zhi-Yong Zhou, Shenzhen (CN); Jian Hu, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 552 days.

(21) Appl. No.: 11/309,436

(22) Filed: Aug. 4, 2006

(65) Prior Publication Data

US 2008/0030958 A1 Feb. 7, 2008

(51) Int. Cl.
*H05K 7/20* (2006.01)
(52) U.S. Cl. ............... 361/704; 361/719; 165/80.3; 165/185; 257/718; 257/719; 174/16.3
(58) Field of Classification Search ............... None
See application file for complete search history.

(56) References Cited

U.S. PATENT DOCUMENTS

| 5,617,292 | A | 4/1997 | Steiner |
| 5,638,258 | A | 6/1997 | Lin |
| 5,771,960 | A * | 6/1998 | Lin ............... 165/80.3 |
| 6,318,452 | B1 * | 11/2001 | Lee ............... 165/80.3 |
| 6,771,506 | B2 * | 8/2004 | Lee et al. ............ 361/704 |
| 6,778,395 | B1 * | 8/2004 | Dong et al. ......... 361/704 |
| 7,061,764 | B2 * | 6/2006 | Lai et al. ........... 361/704 |
| 7,292,442 | B2 * | 11/2007 | Yu et al. ............ 361/704 |
| 7,333,333 | B2 * | 2/2008 | Zhao et al. ......... 361/700 |
| 7,478,667 | B2 * | 1/2009 | Yang ............... 165/80.2 |

FOREIGN PATENT DOCUMENTS

CN 2659092 Y 11/2004

* cited by examiner

*Primary Examiner*—Boris L Chervinsky
(74) *Attorney, Agent, or Firm*—Frank R. Niranjan

(57) ABSTRACT

A clip includes a body with a first end and a second end, an actuating member pivotally coupled to the second end of the body via a pivot, and a movable fastener pivotally coupled to the actuating member at a location apart from and above the pivot. The body has a leg formed at the first end of the body for mounting and the movable fastener has an engaging structure for mounting. The actuating member and the movable fastener are assembled to apply leverage such that when the actuating member is brought to pivot about the pivot, the movable fastener is driven to move between a relaxed position and a locked position where the actuating member is substantially covered by the movable fastener and the engaging structure of the movable fastener securely engages a protrusion of a retention module.

20 Claims, 6 Drawing Sheets

CLIP FOR HEAT DISSIPATION DEVICE

CROSS REFERENCE

Relevant subject matter is disclosed in a pending U.S. patent application Ser. No. 11/308,332, filed on Mar. 16, 2006 and entitled "LOCKING DEVICE FOR HEAT SINK", and application Ser. No. 11/308,724, filed on Apr. 26, 2006 and entitled "HEAT SINK CLIP AND ASSEMBLY", which are assigned to the same assignee as this application.

1. FIELD OF THE INVENTION

The present invention relates to a clip, and more particularly to a clip which can conveniently mount a heat sink onto an electronic package.

2. DESCRIPTION OF RELATED ART

It is well known that electronic packages such as central processing units (CPUs) generate large amount of heat during normal operations. The generated heat must be adequately dissipated from the electronic packages to enable them operate within an acceptable temperature range. Cooling of a CPU is generally achieved by thermally attaching a heat sink to the CPU so that the heat generated by the CPU is dissipated by the heat sink. Usually, the heat sink is held in thermal contact with the CPU by using a clip.

U.S. Pat. No. 5,617,292 shows a conventional clip. The clip comprises a body and a separate leg member. The body has a locking arm formed at one end thereof, and has a securing portion formed at the other end thereof. The separate leg member has an operation handle formed at an upper portion thereof, and a locking foot formed at a lower portion thereof. The separate leg member defines a slot between the operation handle and the locking foot for receiving the securing portion of the body therein.

However, this clip can be difficult to operate; to generate a pressing force against a heat sink, it is necessary to press the operation handle downwardly to secure the locking foot of the separate leg member to a retention module. Pressing the operation handle into position requires a lot of force, and it is not easy for the operator to mount the locking foot onto the retention module.

Therefore, a clip for a heat dissipation device which can overcome the above problem is desired.

SUMMARY OF THE INVENTION

A clip comprises an elongated body with a first end and a second end opposite the first end, an actuating member pivotally coupled to the second end of the body via a pivot, and a movable fastener pivotally coupled to the actuating member at a location apart from the pivot. The body has a leg formed at the first end of the body for mounting and the movable fastener has an engaging structure for mounting. A distance between the pivot and the hinges is quite smaller than that between the pivot and a bottom end of the handle. Therefore, the actuating member and the movable fastener are assembled to apply leverage such that when the actuating member is brought to pivot about the pivot, the movable fastener is easily driven to move between a relaxed position and a locked position where the actuating member is substantially covered by the movable fastener. The movable fastener is stretched when it is moved from the relaxed position to the locked position.

Other advantages and novel features will become more apparent from the following detailed description of preferred embodiments when taken in conjunction with the accompanying drawings, in which:

BRIEF DESCRIPTION OF THE DRAWINGS

Many aspects of the present embodiment can be better understood with reference to the following drawings. The components in the drawings are not necessarily drawn to scale, the emphasis instead being placed upon clearly illustrating the principles of the present embodiment. Moreover, in the drawings, like reference numerals designate corresponding parts throughout the several views.

DETAILED DESCRIPTION OF THE INVENTION

Figure 1:
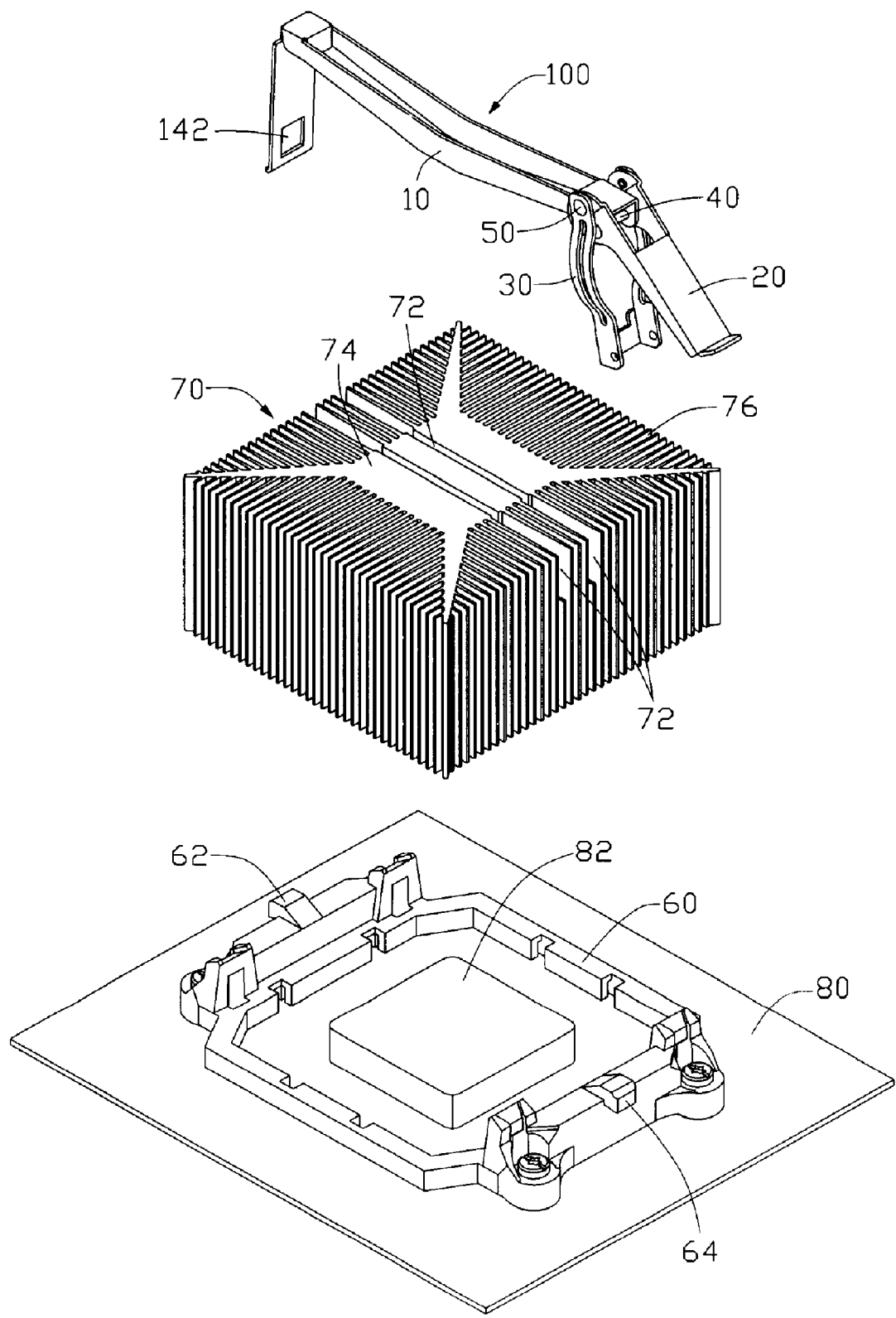
FIG. 1 is an isometric view of a clip in accordance with a preferred embodiment of the present invention, together with a heat sink and an electronic package mounted on a printed circuited board.
Figure 2:
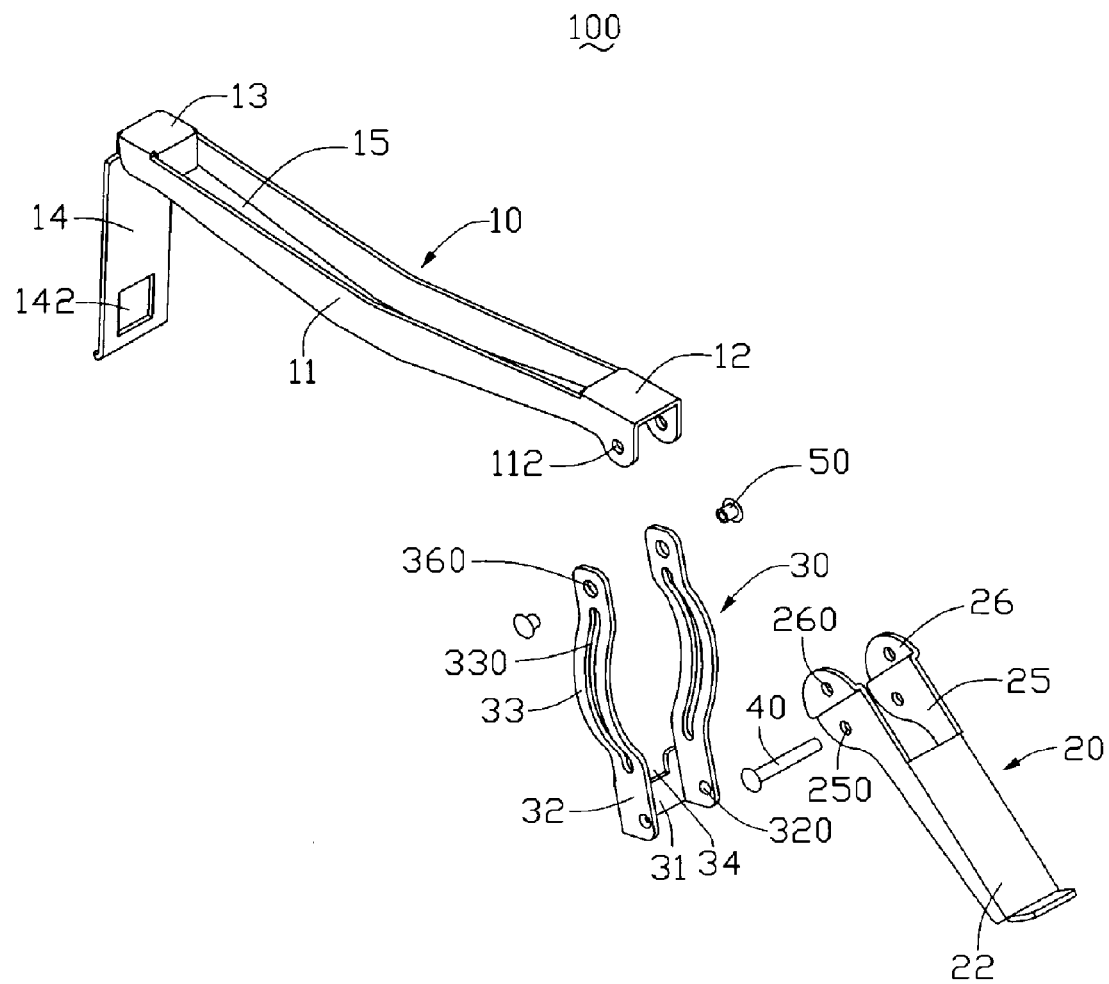
FIG. 2 is an enlarged exploded view of the clip in FIG. 1.

Referring to FIGS. 1-2, a clip 100 in accordance with a preferred embodiment of the present invention is illustrated. The clip 100 is used to secure a heat sink 70 onto an electronic package such as a CPU 82 mounted on a printed circuit board 80. In this embodiment, the heat sink 70 is secured to the CPU 82 through a retention module 60, which provides a pair of protrusions 62, 64 at opposite sides thereof.

The heat sink 70 comprises a central core 74 and a plurality of fins 76 extending vertically and radially outwardly from the central core 74. The core 74 is a solid metal column. The fins 76 are integrally formed with the central core 74 by extrusion, for example. Alternatively, the fins 76 may be individually formed relative to the central core 74 and coupled to the central core 74 subsequently via gluing or soldering. Two grooves 72 are defined in a top portion of the heat sink 70 across the central core 74, for containing the clip 100 therein.

In this embodiment, the clip 100 comprises a body 10, an actuating member 20, and a movable fastener 30.

The body 10 has a first end terminating in a first connecting portion 13 and a second end terminating in a second connecting portion 12. A leg 14 is bent downwardly from the first end of the body 10, and the leg 14 has an opening 142 defined therein for engaging with the protrusion 62 of the retention module 60. There are two spaced arms 11 extending between the first and second connecting portions 13, 12 and connecting the first and second connecting portions 13, 12 together. Therefore, the two arms 11, the first and second connecting portions 13, 12 cooperatively define an elongated slot 15. The slot 15 is provided for some fins 76 and part of the central core 74 to extend therethrough so as to position the body 10 on the heat sink 70. The two arms 11 are plate members, which are perpendicular to the second connecting portion 12, which is also a plate member. A pair of coaxial pivot holes 112 are respectively defined in end portions of the two arms 11 below the second connecting portion 12, wherein the pivot holes 112 are used for pivotally coupling the body 10 to the actuating member 20.

The actuating member 20 comprises a handle 22 and two spaced sidewalls 25 extending from opposite sides of the handle 22. Each sidewall 25 has a pivot hole 250 defined therein corresponding to the pivot holes 112 of the body 10, wherein the actuating member 20 is pivotally coupled to the body 10 via a pivot 40 extending though the pivot holes 250 of the sidewalls 25 and the pivot holes 112 of the body 10. Each sidewall 25 of the actuating member 20 has a step 26 formed at an end thereof opposite to the handle 22, and the steps 26 are formed away from each other. Each step 26 has an aperture 260 defined therein for pivotally coupling the actuating member 20 to the movable fastener 30.

The movable fastener 30 comprises a base plate 31 with a cutout 34 defined at a top portion thereof. Two sidewalls 32 are perpendicularly bent from opposite sides of the base plate 31, and face towards each other. Each sidewall 32 of the movable fastener 30 has a nub 320 formed at a bottom portion thereof projecting toward the other sidewall 32 of the movable fastener 30, and a stretched buffer 33 formed at an upper portion thereof away from the nub 320. Each buffer 33 is C-shaped and has an elongated slot 330 defined therein to reinforce the elasticity of the buffer 33; thus, the buffer 33 is stretchable. Each buffer 33 has an aperture 360 defined in a free end thereof and aligned with corresponding aperture 260 of the step 26 of the actuating member 20, wherein the movable fastener 30 is pivotally coupled to the step 26 of the actuating member 20 via two hinges 50. When the actuating member 20 is brought to pivot around the pivot 40, the movable fastener 30 will accordingly be driven to move in certain directions, e.g., upwardly or downwardly. The hinges 50 are located above the pivot 40.

Figure 3:
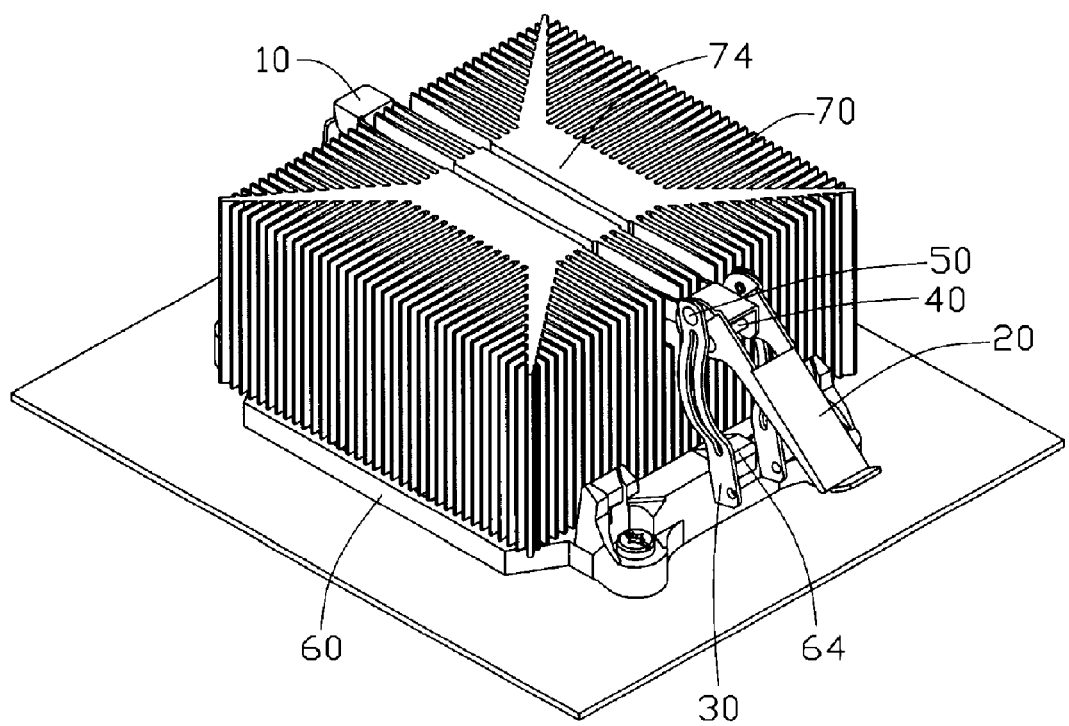
FIG. 3 is an assembled, isometric view of FIG. 1, which illustrates an actuating member thereof being in a relaxed position.
Figure 4:
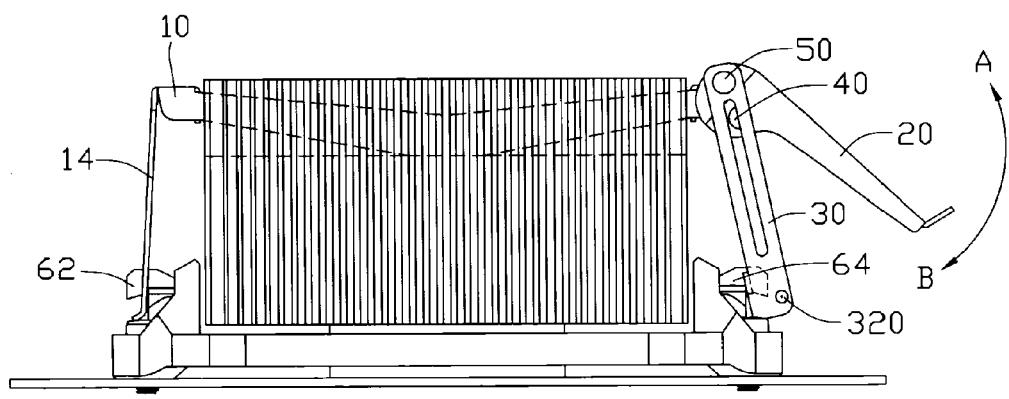
FIG. 4 is a side elevational view of FIG. 3.

Referring to FIGS. 3-6, in assembly, the retention module 60 is mounted to, for example, the printed circuit board 80 on which the CPU 82 is installed. In particular, the retention module 60 is so mounted as to surround the CPU 82 therein. The heat sink 70 is seated on the retention module 60 with the groove 72 thereof being aligned with the protrusions 62, 64 of the retention module 60. The clip 100 is positioned in the heat sink 70 by the arms 11 of the clip 100 being received in the grooves 72 of the heat sink 70. The actuating member 20 is pivoted relative to the heat sink 70 around the pivot 40 along a direction A (e.g. counter-clockwise) and a direction B (e.g. clockwise) opposite to the direction A to thereby move between a relaxed position and a locked position. As shown in FIGS. 3-4, the actuating member 20 is in the relaxed position. The movable fastener 30 is located between the pivot 40 and the heat sink 70. In this relaxed position, the opening 142 of the leg 14 receives the protrusion 62 of the retention module 60 therein, and the cutout 34 of the movable fastener 30 is located below the protrusion 64 of the retention module 60.

Figure 5:
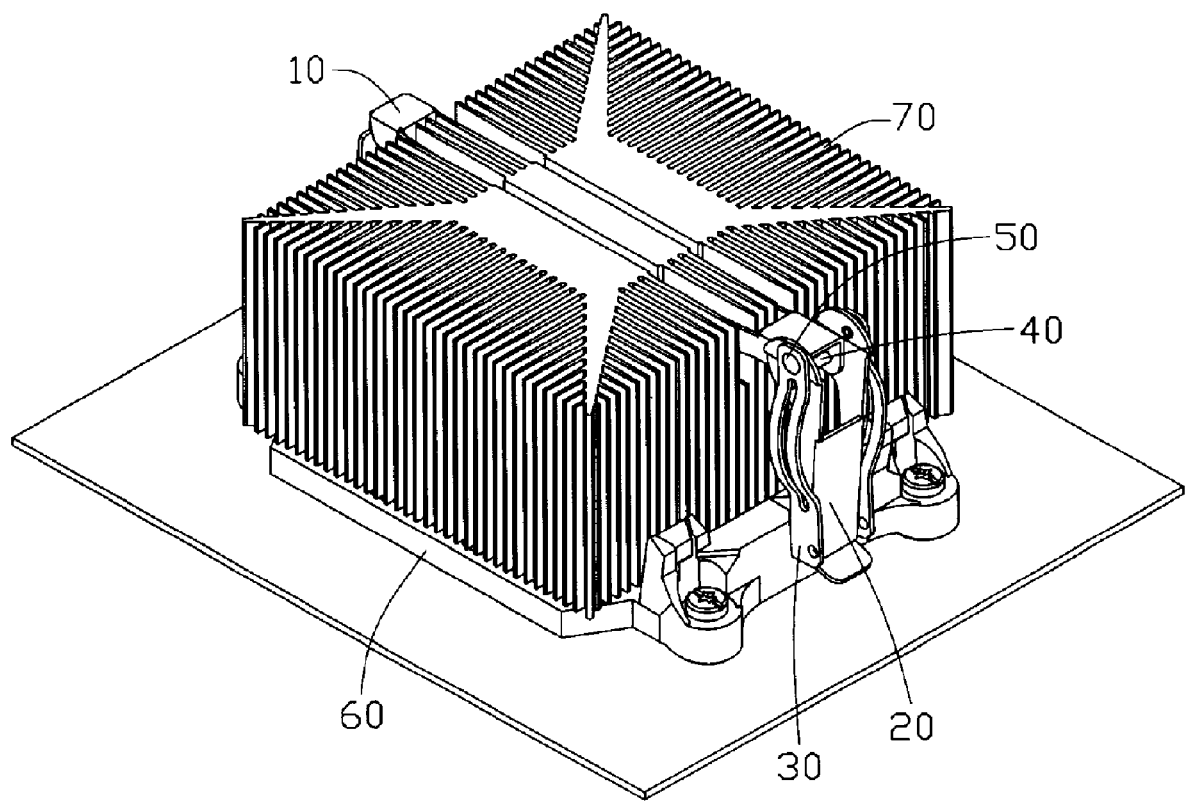
FIG. 5 is an assembled, isometric view of FIG. 1, which illustrates the actuating member thereof being in a locked position.
Figure 6:
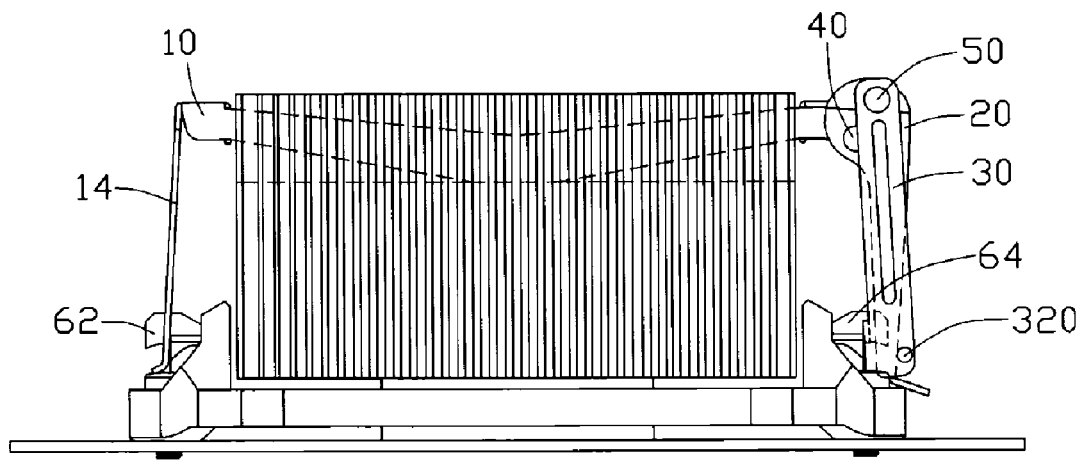
FIG. 6 is a side elevational view of FIG. 5.

In operation, the actuating member 20 is pushed downwardly along the direction B such that it pivots about the pivot 40 to cause the hinge 50 to rotate clockwise around the pivot 40; thus driving the movable fastener 30 to move upwardly. As the actuating member 20 is continuously pushed so that the handle 22 of the actuating member 20 approaches the nubs 320 of the movable fastener 30, the protrusion 64 of the retention module 60 is brought to enter into engagement with the cutout 34 of the movable fastener 30. At the same time, the buffers 33 are stretched to generate a pressing force urging the heat sink 70 downwardly via the arms 11 whereby a bottom surface of the heat sink 70 is brought into contact with the CPU 82. After the handle 22 of the actuating member 20 comes into physical contact with the nubs 320 of the movable fastener 30, the handle 22 is further pushed and as a result, the handle 22 of the actuating member 20 slides past the nubs 320 of the movable fastener 30 to ultimately enter into a receiving space defined cooperatively by the base 31 and the sidewalls 32 of the movable fastener 30 as shown in FIGS. 5-6. At this moment, the actuating member 20 is located in the locked position, wherein the handle 22 of the actuating member 20 is blocked by the nubs 320 of the movable fastener 30, which serve to prevent the handle 22 of the actuating member 20 from disengaging from the locked position. In the locked position, the pivot 40 is located between the heat sink 70 and the movable fastener 30. At the same time, the protrusions 62, 64 of the retention module 60 are respectively firmly engaged in the opening 142 of the leg 14 and the cutout 34 of the movable fastener 30. Therefore, the heat sink 70 is held downwardly by the pressing force resulting from the deformation of the buffers 33, thus bringing the heat sink 70 into contact with the CPU 82.

To unlock the clip 100, the actuating member 20 is turned from the locked position to the relaxed position along the direction A opposite to the direction B. Then, the clip 100 can then be easily removed from the retention module 60.

As described above, the actuating member 20 and the movable fastener 30 are assembled to apply leverage. When a user or operator exerts a relative smaller force on the actuating member 20, the movable fastener 30 can be driven to move so that the clip 100 secures the heat sink 70 onto the CPU 82. Therefore, the clip 100 is user-friendly. Furthermore, when the handle 22 of the actuating member 20 is in a locked position, the handle 22 of the actuating member 20 is received in the receiving space defined in the movable fastener 30; in other words, the actuating member 20 is covered by the movable fastener 30, and the mounting space occupied by the handle 22 of the actuating member 20 is reduced as a result.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A clip, comprising:
    an elongated body comprising opposite first portion and second portion, the body having a leg formed at the first portion of the body for mounting;
    an actuating member pivotally coupled to the second portion of the body via a pivot; and
    a movable fastener pivotally coupled to the actuating member in a location of the actuating member away from the pivot and above the pivot, the movable fastener having an engaging structure for mounting; wherein when the actuating member is brought to pivot about the pivot, the movable fastener is driven to move between a relaxed position and a locked position, in the locked position, the actuating member being substantially covered by the movable fastener.

2. The clip as claimed in claim 1, wherein the movable fastener forms a retainer at a bottom end thereof, in the locked position, the actuating member being blocked by the retainer of the movable fastener thereby preventing the actuating member from disengaging from the locked position, the actuating member being pivotably coupled to the movable fastener at an upper end of the movable fastener.

3. The clip as claimed in claim 1, wherein the movable fastener comprises a base plate at a bottom end thereof, and the engaging structure is provided on the base plate, the base plate has an upper cutout.

4. The clip as claimed in claim 3, wherein a pair of sidewalls respectively extend from opposite side edges of the base plate.

5. The clip as claimed in claim 4, wherein a nub extends from each of the sidewalls of the movable fastener for holding the actuating member in a receiving space cooperatively defined by the base plate and the sidewalls of the movable fastener when the actuating member is located in the locked position.

6. The clip as claimed in claim 4, wherein a buffer extends from each of the sidewalls in a direction away from the engaging structure, a free end of the buffer being connected to the actuating member via a hinge, wherein when the actuating member is pivoted about the pivot, the hinge moves rotatably with respect to the pivot.

7. The clip as claimed in claim 6, wherein the actuating member comprises a pair of sidewalls respectively extending from opposite side edges thereof, and a pair of steps respectively formed at an upper end portion of the sidewalls of the actuating member, wherein the pivot extends through the sidewalls of the actuating member and the body to pivotally couple the actuating member to the body, and wherein the hinge extends through the free end of the buffer and the steps of the actuating member to pivotally couple the movable fastener to the actuating member.

8. The clip as claimed in claim 7, wherein the steps are formed from the sidewalls of the actuating member away from each other.

9. The clip as claimed in claim 6, wherein the buffer has a substantially C-shaped configuration and is stretchable.

10. The clip as claimed in claim 6, wherein the buffer has a slot defined therein.

11. An heat sink assembly, comprising:
a heat sink;
first and second engaging means provided at opposite sides of the heat sink; and
a clip comprising:
a body supported on the heat sink, the body having a first end terminating in a leg for engaging with the first engaging means, and a second end;
an actuating member pivotally coupled to the second end of the body at a first point; and
a movable fastener pivotally coupled to the actuating member at a second point above the first point, the movable fastener having an engaging structure for engaging with the second engaging means;
wherein a distance between the first and second points is smaller than that between the first point and a bottom of the actuating member whereby the actuating member and the movable fastener are used to apply leverage, and wherein when the actuating member is brought to move towards the movable fastener, the movable fastener is driven to move from a relaxed position to a locked position and the second point moves to rotate around the first point, at the locked position, the engaging structure of the movable fastener securely engaging with the second engaging means.

12. The heat sink assembly as claimed in claim 11, wherein the heat sink comprises a central core, a plurality of fins extending radially outwardly from the central core, and a pair of grooves defined therein across the central core for receiving the body of the clip.

13. The heat sink assembly as claimed in claim 11, wherein the movable fastener comprises a base plate, and a pair of sidewalls respectively extending from opposite side edges of the base plate, the actuating member being received by the base plate cooperating with the sidewalls when at the locked position.

14. The heat sink assembly as claimed in claim 13, wherein at least one nub extends from one of the sidewalls of the movable fastener, for holding the actuating in place when the actuating member is located in the locked position.

15. The heat sink assembly as claimed in claim 13, wherein a buffer extends from each of the sidewalls of the actuating member in a direction away from the engaging structure, a free end of the buffer being connected to the actuating member via a hinge, wherein when the actuating member is pivoted about the body, the buffers of the movable fastener are stretched to cause the engaging structure of the movable fastener to securely engage with the second engaging means.

16. The heat sink assembly as claimed in claim 11, wherein when the actuating member is pushed to pivot relative to the body along a first direction so that the movable fastener is moved from the relaxed position to the locked position, the second point moves to rotate about the first point along a second direction opposite the first direction.

17. A heat sink assembly comprising:
a heat-generating electronic component;
a retention module disposed around the electronic component and having opposite first and second protrusions;
a heat sink mounted on the electronic component and thermally connecting therewith;
a clip having an elongate body mounted on the heat sink, a leg extending downwardly from a first end of the elongate body and engaging with the first protrusion, an actuating member pivotably having an upper end connected to a second end of the elongate body at a first point, a resilient movable fastener having a bottom engaging structure and an upper end pivotably connected with the actuating member at a second point above the first point, wherein when the actuating member is pivoted to move toward the movable fastener, the movable fastener moves from a relaxed position to a locked position during which the movable fastener is stretched, at the locked position the bottom engaging structure of the movable fastener securely engaging with the second protrusion.

18. The heat sink assembly of claim 17, wherein a distance between the first point and the second point is smaller than that between the first point and a bottom of the actuating member.

19. The heat sink assembly of claim 17, wherein when the movable member moves from the relaxed position to the locked position, the second point moves to rotate about the first point.

20. The heat sink assembly of claim 19, wherein a rotation direction of the second point is opposite that of the actuating member when the actuating member is pivoted to move toward the movable fastener to cause the movable fastener to move from the relaxed position to the locked position.

* * * * *